United States Patent
Nariman et al.

(10) Patent No.: US 6,812,506 B1
(45) Date of Patent: Nov. 2, 2004

(54) POLYSILICON LINEWIDTH MEASUREMENT STRUCTURE WITH EMBEDDED TRANSISTOR

(75) Inventors: Hormuzdiar E. Nariman, Austin, TX (US); Derick J. Wristers, Bee Caves, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/298,923

(22) Filed: Nov. 19, 2002

(51) Int. Cl.[7] ............................................. H01L 27/10
(52) U.S. Cl. ........................ 257/204; 257/202; 257/203
(58) Field of Search ................. 257/202–204, 257/83, 296–350; 438/238, 239

(56) References Cited

U.S. PATENT DOCUMENTS

| | | | | |
|---|---|---|---|---|
| RE35,356 E | * | 10/1996 | Gill | |
| 6,075,267 A | * | 6/2000 | Taji et al. | |
| 6,269,199 B1 | * | 7/2001 | Maloney | 385/14 |
| 6,486,507 B1 | * | 11/2002 | Saito | 257/315 |

* cited by examiner

*Primary Examiner*—Fetsum Abraham

(57) ABSTRACT

A semiconductor device includes a grating structure having a plurality of parallel lines, and at least one of the multiple parallel lines is a gate electrode line of a transistor, which includes source/drain regions proximate to the gate electrode line, and vias extending to the gate electrode line and the source/drain regions. A method of manufacturing the semiconductor device is also disclosed.

15 Claims, 5 Drawing Sheets

POLYSILICON LINEWIDTH MEASUREMENT STRUCTURE WITH EMBEDDED TRANSISTOR

FIELD OF THE INVENTION

The present invention relates to the manufacturing of semiconductor devices, and more particularly, to forming measurement structures that include embedded transistors.

BACKGROUND OF THE INVENTION

Over the last few decades, the semiconductor industry has undergone a revolution by the use of semiconductor technology to fabricate small, highly integrated electronic devices, and the most common semiconductor technology presently used is silicon-based. A large variety of semiconductor devices have been manufactured having various applications in numerous disciplines. One silicon-based semiconductor device is a metal-oxide-semiconductor (MOS) transistor. The MOS transistor is one of the basic building blocks of most modern electronic circuits. Importantly, these electronic circuits realize improved performance and lower costs, as the performance of the MOS transistor is increased and as manufacturing costs are reduced.

A typical MOS device includes a bulk semiconductor substrate on which a gate electrode is disposed. The gate electrode, which acts as a conductor, receives an input signal to control operation of the device. Source and drain regions are typically formed in regions of the substrate adjacent the gate electrodes by doping the regions with a dopant of a desired conductivity. The conductivity of the doped region depends on the type of impurity used to dope the region. The typical MOS device is symmetrical, in that the source and drain are interchangeable. Whether a region acts as a source or drain typically depends on the respective applied voltages and the type of device being made. The collective term source/drain region is used herein to generally describe an active region used for the formation of either a source or drain.

During the manufacturing process, a semiconductor device undergoes many types of metrology to ensure the quality of the semiconductor device. For example, processes, such as lithography, are controlled, in part, by taking dimensional measurements of certain features of the semiconductor device formed by the lithography process. One type of measurement technique used to measure the dimensions of a structure in a semiconductor device is scatterometry. Scatterometry is a non-destructive optical technique that records and analyzes changes in the intensity of light reflected from a periodic scattering surface. By measuring and analyzing the light diffracted from a patterned periodic sample, the dimensions of the sample structure can be measured.

A structure commonly known as a grate is used typically used with scatterometry to determine dimensions, such as gate electrode width, in a semiconductor device. The grate is comprised of several parallel lines that are formed in the same manner as the gate electrodes of the semiconductor device. The grate, however, serves no other purpose. Because of the ever increasing need to fit more transistors into a semiconductor device, there is a desire to improve the utilization of all available space in a given semiconductor device. Furthermore, there is a recognized desire to be able to compare the measured line width of a gate electrode of a functional transistor to other electrical characteristics of the transistor. Accordingly, a need exists for an improved semiconductor device and method of forming the same that allows for improved space utilization and the ability to compare different electrical characteristic performance of a transistor.

SUMMARY OF THE INVENTION

This and other needs are met by embodiments of the present invention which provide a semiconductor device in which the same structure can be used for inline metrology of the semiconductor device and also serve as a gate electrode line of a transistor. The semiconductor device includes a grating structure having a plurality of parallel lines, and at least one of the parallel lines is a gate electrode line of a transistor, which includes source/drain regions proximate to the gate electrode line, and vias extending to the gate electrode line and the source/drain regions.

In another aspect of the present invention, the lines are formed from polysilicon. Also, the gate electrode line is positioned at a center of the grating structure, as viewed from above, and the gate electrode line has a greater length than other lines in the grating structure.

In another embodiment of the present invention, a method of manufacturing a semiconductor device is provided. The method includes depositing a layer over a substrate; and etching the layer to form a grating structure. The grating structure includes a plurality of parallel lines and at least one of the multiple parallel lines is a gate electrode line of a transistor. The method also includes the steps of forming an insulator layer prior to depositing the layer, forming source/drain regions proximate to the gate electrode line, and forming vias to the source/drain regions and to the gate electrode line.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein.

DETAILED DESCRIPTION OF THE INVENTION

The present invention allows for greater space utilization by forming active transistors in a grating structure.

Furthermore, by forming transistors in a grating structure, the line width of the active transistors can be determined by scatterometry and this information can be compared to other electrical characteristics of the transistor.

Figure 1:
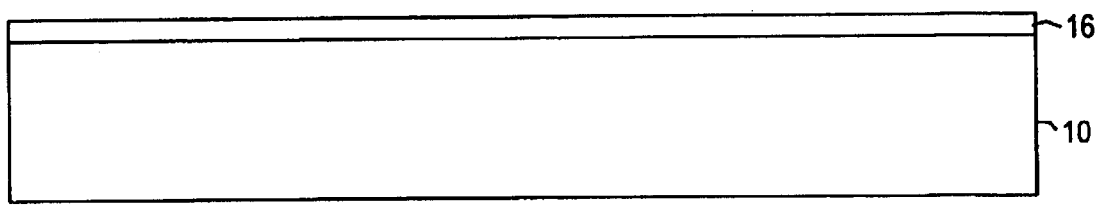
FIGS. 1–4 schematically illustrate sequential phases of a method of forming dummy and functional gate electrode lines according to one embodiment of the present invention.

In FIG. 1, a gate dielectric 16 is formed on the top surface of the substrate 10, and the gate dielectric 16 is not limited as to a particular material. For example, the gate dielectric 16 can be formed from a high-K material or from a material such as silicon dioxide. The formation of a silicon dioxide gate dielectric 16, for example, can be accomplished using thermal oxidation at temperatures between about 700 and about 1000° C. in an oxygen-steam ambient. Although not limited in this manner, the gate dielectric 16 can have a thickness between about 3 and about 20 nanometers. The substrate 10 can be formed from such materials as silicon, strained silicon, and silicon-on-insulator(SOI).

Figure 2:
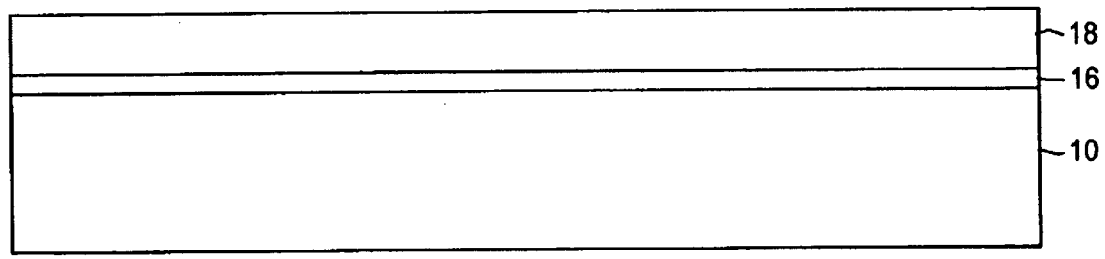
Figure 3:
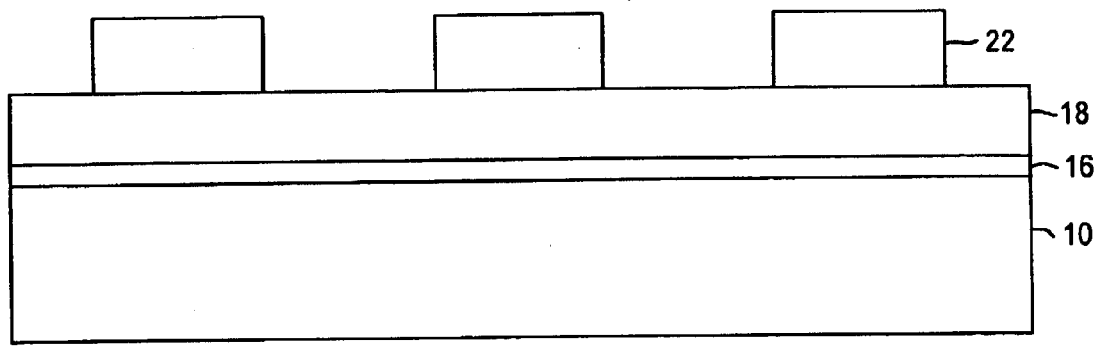
Figure 4:
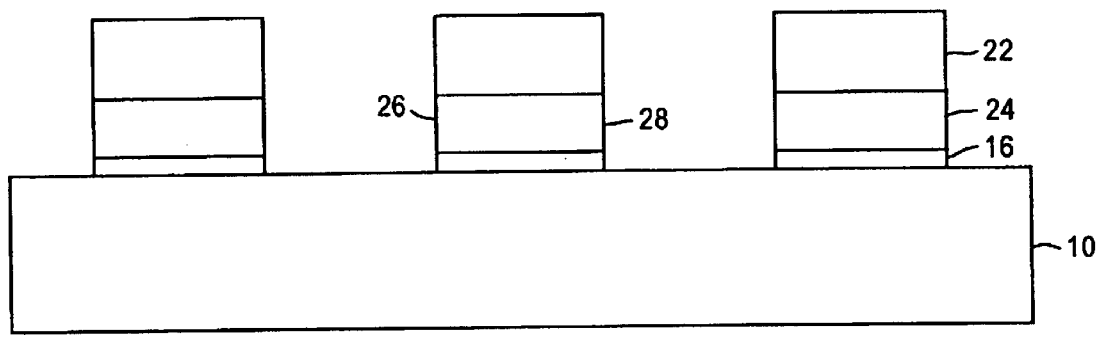

After formation of the gate dielectric 16, a gate electrode is formed over the gate dielectric 16. Although not limited in this manner, an exemplary method of forming a gate electrode is illustrated in FIGS. 2–4. In FIG. 2, a layer of undoped polysilicon 18 is blanket deposited, for example by low pressure chemical vapor deposition (LPCVD) at temperatures between about 600 and about 800° C., on the top surface of gate dielectric 16. Although not limited in this manner, the polysilicon layer 18 can have a thickness between about 50 and about 500 nanometers. The polysilicon layer 18 can then be implanted with nitrogen ions. The implanted nitrogen ions, for example, can be used to retard the diffusion of boron atoms. The implantation of the nitrogen ions can be at a dosage between about $15 \times 10^{14}$ and about $5 \times 10^5$ dopants/cm$^2$ and at an energy level between about 20 and about 200 keV.

The polysilicon layer 18 is then etched to form the gate electrode. As illustrated in FIG. 3, the etching involves forming a photoresist 22 on the polysilicon layer 18, and selectively irradiating the photoresist 22 using a photolithographic system, such as a step and repeat optical projection system, in which ultraviolet light from a mercury-vapor lamp is projected through a first reticle and a focusing lens to obtain a first image pattern. The photoresist 22 is then developed, and the irradiated portions of the photoresist 22 are removed to provide openings in the photoresist 22. The openings expose portions of the polysilicon layer 18, which when removed, will define the gate electrode.

In FIG. 4, an etch, typically anisotropic, is applied to remove the exposed portions of the polysiliconslayer 18 and the underlying portions of the gate dielectric 16. After etching, the remaining portion of the polysilicon layer 18 provides a gate electrode 24 having opposing sidewalls 26, 28. Although not limited in this manner, the width of the gate electrode 24 between the sidewalls 26, 28 can be from about 20 to 250 nanometers.

Figure 5A:
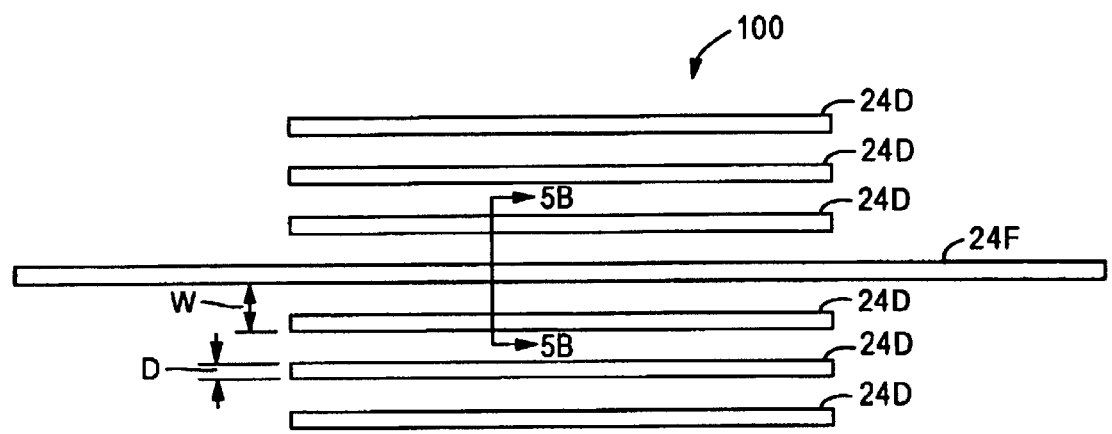
FIG. 5A schematically illustrates a top plan view of a grating structure according to an embodiment of the present invention.
Figure 5B:
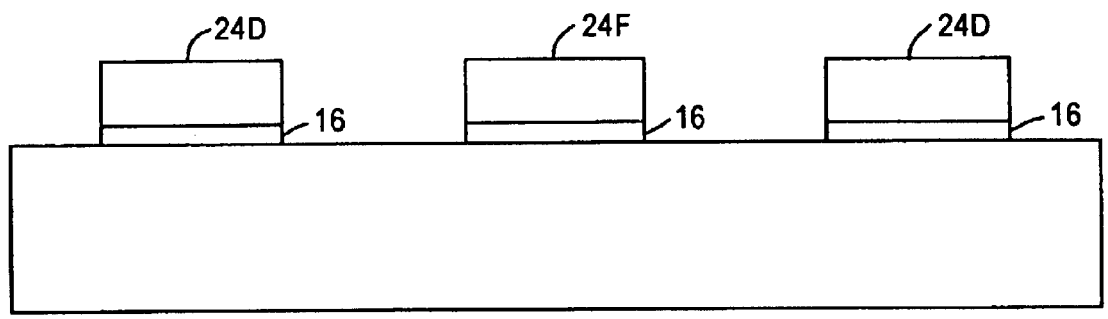
FIG. 5B is a cross-section taken along line 5B—5B of FIG. 5A.

FIGS. 5A and 5B respectively illustrate top and cross-sectional side views of a grating structure 100 after-the photo resist 22 is stripped. The grating structure 100 comprises dummy gate electrodes or dummy lines 24D and at least one functional gate electrode line 24F. The grating structure 100 is not limited as to a particular line width D or pitch W of the gate electrode lines 24. However, in at least one aspect of the grating structure 100, the line width D is 60 nanometers or less and the pitch W is about three times the line width D. Although not limited in this manner, the functional gate electrode line 24F can be positioned at the center of the grating structure 100, as viewed from above.

After the grating structure 100 has been formed, the dimensional characteristics of the lines 24 in the grating structure 100 can be measured using scatterometry. The method of determining dimensional characteristics of the lines 24 by scatterometry is not limited as to the type of scatterometry tool. Examples of scatterometry tools include 2 Theta-type systems and lens-type systems. The scatterometry tool may use white light, or other wavelength or combination of wavelengths, depending on the specific implementation. Typically, the scatterometry tool generates an incident beam that has a wide spectral composition, and the intensity of the light changes relative to changes in wavelength. The angle of incidence of the light onto the substrate may also vary, depending on the specific implementation. Also, the profile traces generated by the scatterometry tool may be based upon a comparison of light intensity to wavelength (for white light, fixed angle type scaterometry tools) or a comparison of intensity to incident angle (for angle resolved systems that use a single light source). For example, a spectroscopic ellipsometer (single angle, many wavelengths), or a laser (single wavelength, many angles) may be used. In addition, the intensity of the reflected light may be measured as s- and p-polarization over either multiple angles or at multiple wavelengths.

Figure 6:
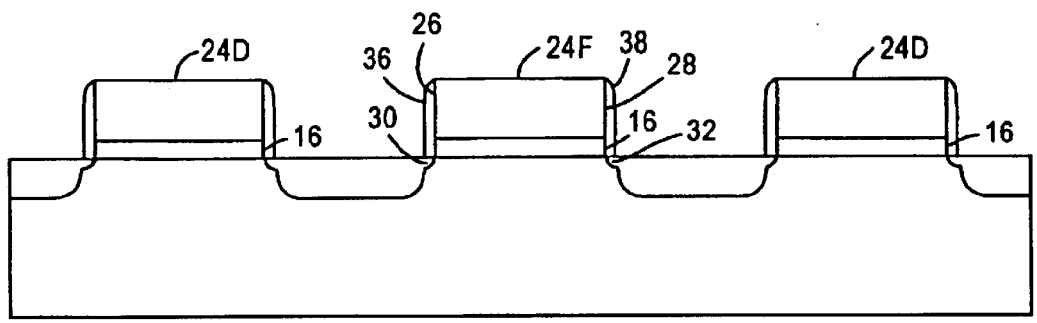
FIGS. 6 and 7 schematically illustrate sequential phases of a method of forming transistors in the grating structure of FIGS. 5A and 5B.
Figure 7:
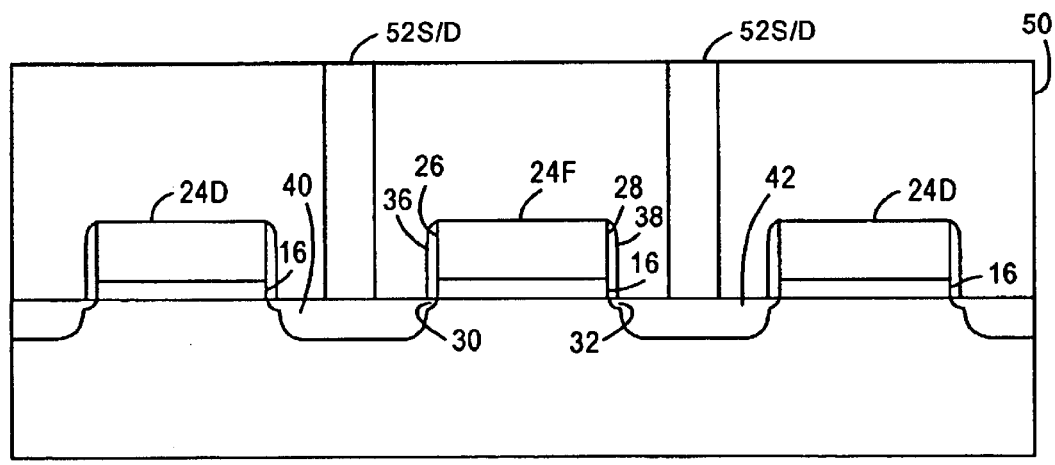
Figure 8:
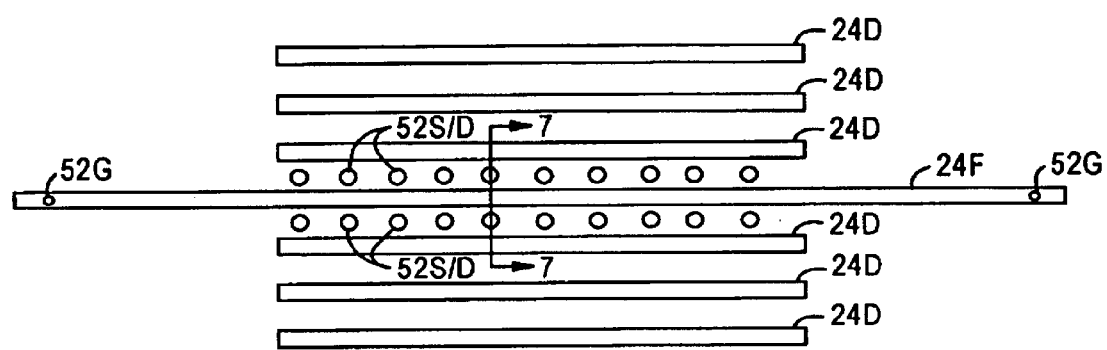
FIG. 8 schematically illustrates a top plan view of the grating structures of FIG. 5A with vias extending to a functional gate electrode and source/drain regions.

After the dimensional characteristics of the lines 24 are measured using scatterometry, the semiconductor device can be completed in any conventional manner, and an illustrative series of processing steps are shown in FIGS. 6–8. In FIG. 6, lightly doped (LDD) source/drain extensions 30, 32 are formed by an ion implantation. The ion implantation may be an n-type dopant, such as arsenic or phosphorus, if an NMOSFET is desired, or a p-type dopant, such as boron, if a PMOSFET is desired. Illustrative examples of implant energies and dosages for doping respectively range between about 2 and about 20 keV and between about $5 \times 10^{14}$ and about $3 \times 10^{15}$ dopants/cm$^2$. The source/drain extensions 30, 32 are formed within the substrate 10 immediately adjacent to the sidewalls 26, 28 and are self-aligned with the gate electrode 24. After implantation, annealing can be conducted to activate and recrystallize the source/drain extensions 30, 32. Alternatively, the annealing can occur after formation of the source/drain regions. Typically, the source/drain extensions 30, 32 extend down from the surface of the silicon substrate 10 to a depth of between about 5 nanometers and about 30 nanometers.

Sidewall spacers 36, 38 are then formed following the implantation of the source/drain extensions 30, 32. Formation of the sidewall spacers 36, 38 typically involves blanket depositing a spacer material over the substrate 10. The spacer material can be silicon nitride or some other material, such as plasma-enhanced oxide (PEOX) or tetraethoxysilane (TEOS) oxide. The blanket deposition is followed by an anisotropic etch, which removes the spacer material except for the sidewall spacers 36, 38 immediately adjacent to the sidewalls 26, 28 of the gate electrode 24 and over the substrate 10.

After formation of the sidewall spacers 36, 38, heavily doped (HDD) or moderately doped (MDD) source/drain regions 40, 42 are formed by a second ion implantation. The source/drain regions 40, 42 are formed within the substrate 10 and extend past the source/drain extensions 30, 32 immediately adjacent to the sidewall spacers 36, 38. The sidewall spacers 36, 38 act as masks, which protect portions of the source/drain extensions 30, 32 from being heavily doped. Illustrative examples of implant energies and dosages for doping respectively range between about 0.5 keV and about 60 keV and between about $1 \times 10^{14}$ and $5 \times 10^{15}$ dopants/cm$^2$.

In FIGS. 7 and 8, after implantation of the source/drain regions 40, 42, an interlevel dielectric layer 50 is formed over the substrate, and vias 52S/D are formed to the source/drain regions 40, 42 adjacent the functional gate electrode 24F. Furthermore, vias 52G are also formed to electrically connect the functional gate electrode 24F with interlevel connections (not shown) of the semiconductor device.

By providing active transistors in a grating structure, the present invention allows for greater space utilization of the semiconductor device. After determining the line width of the gate electrodes of the active transistors, the line width can later be compared to other electrical characteristics of the active transistor.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well-known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concepts as expressed herein.

What is claimed is:

1. A semiconductor device, comprising:
    a grating structure including a plurality of parallel lines having substantially identical heights, wherein
    at least one of the multiple parallel lines is a gate electrode line of a transistor, and
    the gate electrode line has a greater length than other lines in the grating structure.

2. The semiconductor device according to claim 1, wherein the lines are formed from polysilicon.

3. The semiconductor device according to claim 1, wherein the gate electrode line is positioned at a center of the grating structure, as viewed from above.

4. The semiconductor device according to claim 1, further comprising source/drain regions proximate to the gate electrode line.

5. The semiconductor device according to claim 4, further comprising vias respectively extending to the gate electrode line and the source/drain regions.

6. A method of manufacturing a semiconductor device, comprising the steps of:
    depositing a layer over a substrate; and
    etching the layer to form a scatterometry structure, wherein
    the scatterometry structure includes a plurality of parallel lines and at least one of the multiple parallel lines is a gate electrode line of a transistor, and
    the gate electrode line has a greater length than other lines in the grating structure.

7. The method according to claim 6, further comprising the steps of:
    forming an insulator layer prior to depositing the layer;
    forming source/drain regions proximate to the gate electrode line; and
    forming vias to the source/drain regions and to the gate electrode line.

8. The method according to claim 6, wherein the layer is formed from polysilicon.

9. The method according to claim 6, wherein the gate electrode line is positioned at a center of the scatterometry structure, as viewed from above.

10. The method according to claim 6, further comprising the step of performing a scatterometry test on the scatterometry structure.

11. A scatterometry structure with embedded CMOS transistors, comprising:
    a plurality of parallel lines, wherein
    at least one of the multiple parallel lines is a gate electrode line of the transistor, and
    the gate electrode line has a greater length than a length of others of the parallel lines.

12. The scatterometry structure according to claim 11, wherein the lines are formed from polysilicon.

13. The scatterometry structure according to claim 11, wherein the gate electrode line is positioned at a center of the parallel lines, as viewed from above.

14. The scatterometry structure according to claim 11, further comprising source/drain regions proximate to the gate electrode line.

15. The scatterometry structure according to claim 14, further comprising vias respectively extending to the gate electrode line and the source/drain regions.

* * * * *